(12) United States Patent
Chatani

(10) Patent No.: US 12,014,894 B2
(45) Date of Patent: Jun. 18, 2024

(54) ELECTRON SOURCE, METHOD FOR MANUFACTURING SAME, AND DEVICE PROVIDED WITH ELECTRON SOURCE

(71) Applicant: Denka Company Limited, Tokyo (JP)

(72) Inventor: Hiromitsu Chatani, Tokyo (JP)

(73) Assignee: Denka Company Limited, Tokyo (JP)

( * ) Notice: Subject to any disclaimer, the term of this patent is extended or adjusted under 35 U.S.C. 154(b) by 0 days.

(21) Appl. No.: 18/258,461

(22) PCT Filed: Dec. 20, 2021

(86) PCT No.: PCT/JP2021/047021
§ 371 (c)(1),
(2) Date: Jun. 20, 2023

(87) PCT Pub. No.: WO2022/138558
PCT Pub. Date: Jun. 30, 2022

(65) Prior Publication Data
US 2024/0029989 A1 Jan. 25, 2024

(30) Foreign Application Priority Data

Dec. 25, 2020 (JP) ................. 2020-217530

(51) Int. Cl.
*H01J 1/146* (2006.01)
*H01J 1/16* (2006.01)
*H01J 37/065* (2006.01)

(52) U.S. Cl.
CPC ............... *H01J 1/146* (2013.01); *H01J 1/16* (2013.01); *H01J 37/065* (2013.01); *H01J 2237/06308* (2013.01)

(58) Field of Classification Search
CPC .. H01J 1/146; H01J 1/16; H01J 37/065; H01J 2237/06308
See application file for complete search history.

(56) References Cited

U.S. PATENT DOCUMENTS

2010/0237762 A1 9/2010 Nonogaki et al.

FOREIGN PATENT DOCUMENTS

| JP | S50-046477 A | 4/1975 |
|----|---|---|
| JP | S64-007450 A | 1/1989 |
| JP | 2000-246451 A | 9/2000 |
| JP | 2002-358922 A | 12/2002 |
| JP | 2004-512639 A | 4/2004 |
| JP | 2008-262794 A | 10/2008 |
| JP | WO2009/044871 A1 | 4/2009 |

(Continued)

OTHER PUBLICATIONS

English machine translation of WO2009044871 (Year: 2011).*

(Continued)

*Primary Examiner* — Anne M Hines
(74) *Attorney, Agent, or Firm* — Leydig, Voit & Mayer, Ltd.

(57) ABSTRACT

A method for manufacturing an electron source includes steps of sandwiching a welding object in which a tip of an electron emission material and a tungsten filament overlap in direct contact between a pair of welding electrodes, and welding the tip and the tungsten filament by causing a current to flow while pressing forces are applied to the welding object by the pair of welding electrodes. A thickness of the welding object is within a range of 50 to 500 μm.

8 Claims, 7 Drawing Sheets

(56) References Cited

FOREIGN PATENT DOCUMENTS

| | | |
|---|---|---|
| JP | 2010-015966 A | 1/2010 |
| JP | 2010-238384 A | 10/2010 |
| JP | 2018-142453 A | 9/2018 |
| JP | 6805306 B1 | 12/2020 |
| JP | 2021-038423 A | 3/2021 |
| JP | 2023-036830 A | 3/2023 |
| WO | WO 02/033722 A2 | 4/2002 |
| WO | WO 2009/044871 A1 | 4/2009 |
| WO | WO-2009044871 A1 * | 4/2009 ............. B82Y 10/00 |

OTHER PUBLICATIONS

The International Bureau of WIPO, International Preliminary Report on Patentability issued in International Application No. PCT/JP2021/047021 (Jul. 6, 2023).
Japan Patent Office, Office Action issued in Japanese Patent Application No. P2022-522320 (Jun. 28, 2022).
Hasegawa, Kazuyoshi, "Chapter 1 Welding Processes and Equipment", *Journal of the Japan Welding Society*, vol. 79(4): pp. 316-327 (2010).
Yada, Keiji, "Various Kinds of Thermionic Emitters", *Electron Microscopy*, vol. 21(3): pp. 162-166 (1987).
Japan Patent Office, International Search Report issued in International Application No. PCT/JP2021/047021 (Mar. 8, 2022).
Nagata, Haruto et al., "Thermal Field Emission Observation of a Single-Crystal $LaB_6$ ". *Journal of Applied Physics*, vol. 68(7): pp. 3614-3618 (1990).
European Patent Office, Extended European Search Report issued in European Patent Application No. 21910702.6 (Apr. 24, 2024).

* cited by examiner (a)

(b)

ELECTRON SOURCE, METHOD FOR MANUFACTURING SAME, AND DEVICE PROVIDED WITH ELECTRON SOURCE

CROSS-REFERENCE TO RELATED APPLICATIONS

This patent application is the U.S. national phase of International Application No. PCT/JP2021/047021, filed on Dec. 20, 2021, which claims the benefit of Japanese Patent Application No. 2020-217530, filed Dec. 25, 2020, the disclosures of which are incorporated herein by reference in their entireties for all purposes.

TECHNICAL FIELD

The present disclosure relates to an electron source, a method for manufacturing the same, and a device provided with the electron source.

BACKGROUND ART

Electron sources are used in electron microscopes and semiconductor inspection devices, for example. An electron source is provided with a tip constituted using an electron emission material. Specific examples of an electron emission material include a $LaB_6$ (lanthanum hexaboride) single crystal, a HfC single crystal, and an IrCe compound.

For example, an electron source using a $LaB_6$ single crystal is constituted of a $LaB_6$ single crystal tip, a tungsten filament for heating this tip by means of electrification, and a bonding material for fixing the tip to the tungsten filament. Manufacturing Example 1 of Patent Literature 1 discloses that an intermediate layer is provided using a paste including TaC powder on a side surface of a lower portion of a $LaB_6$ single crystal tip and a support metal layer is provided using a Ta foil. In this Manufacturing Example 1, a thermoelectronic emission cathode is assembled by spot-welding a W wire having a diameter of 150 μm to the support metal layer. Patent Literature 2 discloses a sintering material for an electron beam generation cathode member including 90 mass % or more of a compound consisting of iridium and cerium.

CITATION LIST

Patent Literature

[Patent Literature 1] Japanese Unexamined Patent Publication No. H1-7450
[Patent Literature 2] Japanese Patent No. 6805306

SUMMARY OF INVENTION

Technical Problem

As in Manufacturing Example 1 of Patent Literature 1, when a layer including tantalum (Ta) is interposed between a $LaB_6$ tip and a tungsten filament (W wire), the degree of vacuum deteriorates due to a reaction of tantalum with $LaB_6$ at the time of electrification and heating, and this may cause emission instability of a cathode. For this reason, it is desirable to have a structure in which a tip of an electron emission material is directly bonded to a tungsten filament. However, in the related art, a tip of an electron emission material and a tungsten filament cannot be firmly bonded by welding, and there is a risk that the tip may fall. For this reason, an electron source having such a structure has not been put to practical use.

The present disclosure provides a method for manufacturing an electron source having a structure in which a tip of an electron emission material is directly bonded to a tungsten filament. In addition, the present disclosure provides an electron source, in which deterioration in degree of vacuum can be curbed compared to electron sources in the related art using tantalum for fixing a tip and a stable emission current can be obtained, and a device provided with the same.

Solution to Problem

A method for manufacturing an electron source according to an aspect of the present disclosure includes steps of: sandwiching a welding object in which a tip of an electron emission material and a tungsten filament overlap in direct contact between a pair of welding electrodes; and welding the tip and the tungsten filament by causing a current to flow while pressing forces are applied to the welding object by the pair of welding electrodes. A thickness of the welding object is within a range of 50 to 500 μm. Examples of the electron emission material include a $LaB_6$ single crystal, a HfC single crystal, and an IrCe compound. An IrCe compound is $Ir_2Ce$, $Ir_3Ce$, $Ir_7Ce_2$, or $Ir_5Ce$, for example.

The inventors attempted to directly weld a tip of an electron emission material ($LaB_6$ single crystal) and a tungsten filament using a resistance welding machine having the constitution illustrated in (a) and (b) in FIG. 3. As a result, if a thickness of a welding object (the total thickness of the tip and the tungsten filament) was within a range of 50 to 500 μm, the welding object could be locally heated to a high temperature by means of electrification using a pair of welding electrodes, and thus the tip and the tungsten filament could be firmly bonded by welding.

A cross-sectional shape of a part in the tip welded to the tungsten filament is a square shape or a rectangular shape of which a length of one side is 10 to 300 μm, for example.

An electron source according to another aspect of the present disclosure includes a tip of an electron emission material, a tungsten filament, and a welding portion in which the tip and the tungsten filament are directly bonded. The thickness of the welding portion is 5.0 to 500 μm. Since the tip and the tungsten filament are directly bonded, deterioration in degree of vacuum can be curbed compared to electron sources in the related art having a layer including tantalum interposed between both of them, and a stable emission current can be obtained.

The tungsten filament according to the present disclosure may include elements other than tungsten (for example, rhenium, aluminum, silicon, and potassium) in accordance with the required performance.

A device according to another aspect of the present disclosure includes the foregoing electron source. Examples of a device provided with an electron source include electron microscopes, semiconductor manufacturing devices, and inspection devices.

Advantageous Effects of Invention

According to the present disclosure, a method for manufacturing an electron source having a structure in which a tip of an electron emission material is directly bonded to a tungsten filament is provided. In addition, according to the present disclosure, an electron source, in which deterioration in degree of vacuum can be curbed compared to electron sources in the related art using tantalum for fixing a tip and a stable emission current can be obtained, and a device provided with the same are provided.

Figure 3:
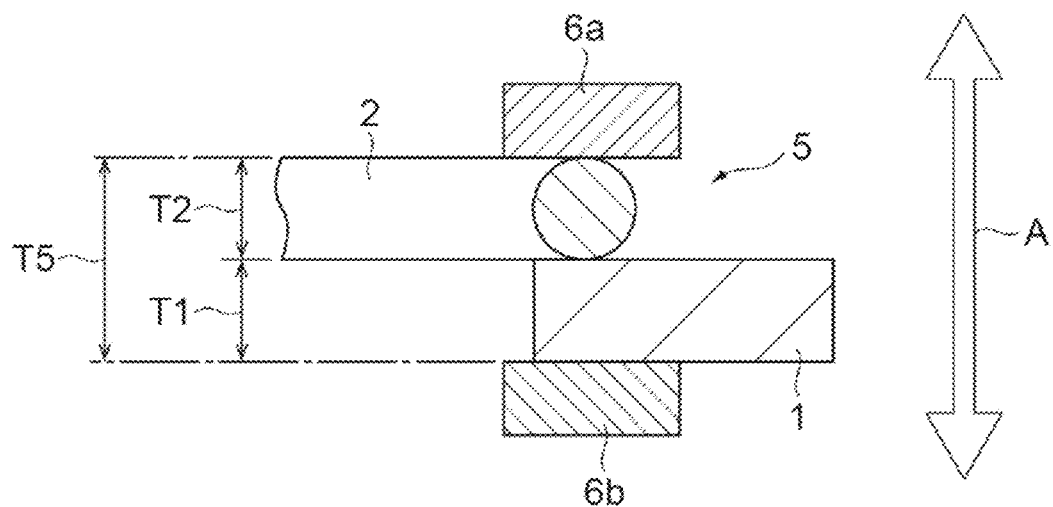
Figure 3:
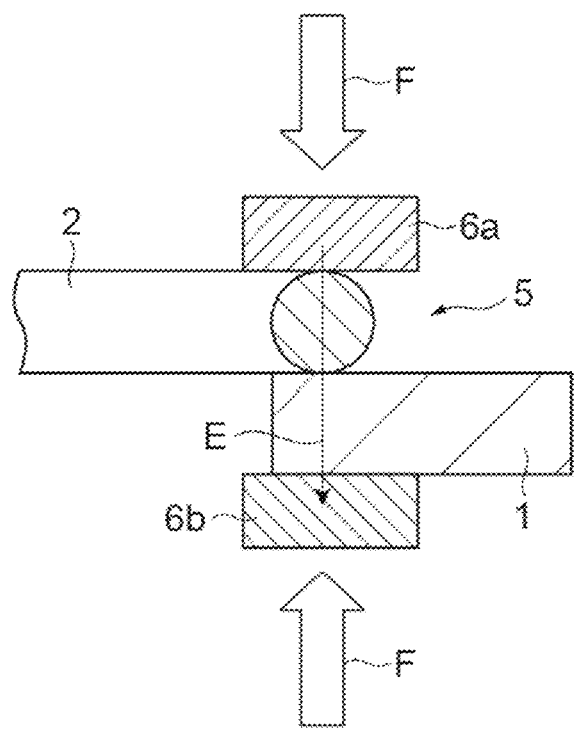

(a) in FIG. 3 is a cross-sectional view schematically illustrating a state where a welding object in which a tip and a tungsten filament overlap in direct contact is sandwiched between a pair of welding electrodes, and (b) in FIG. 3 is a cross-sectional view schematically illustrating a condition in which the tip and the tungsten filament are welded by causing a current to flow while pressing forces are applied to the welding object by the pair of welding electrodes.

Figure 4:
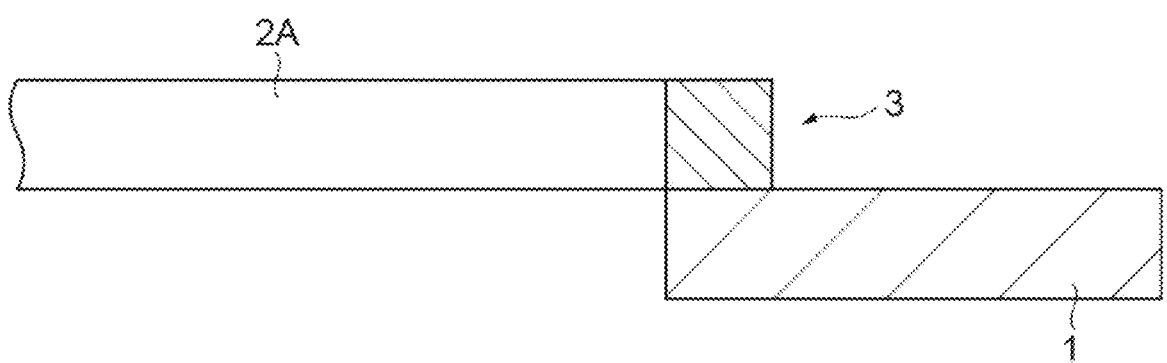

FIG. 4 is a cross-sectional view schematically illustrating another form of a welding portion in the electron source.

Figure 5:
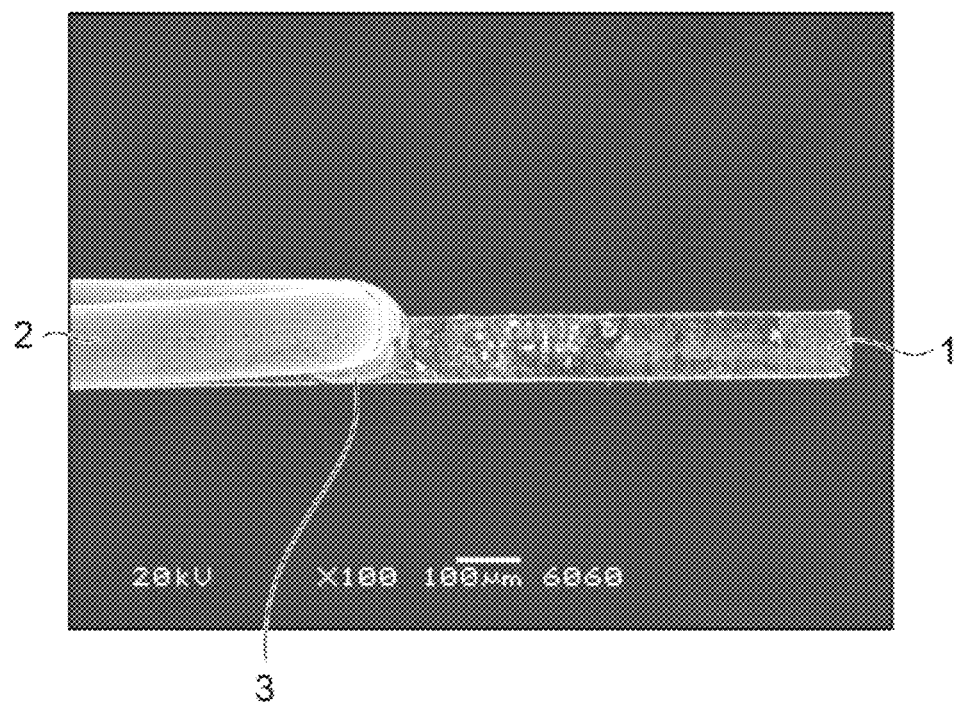

FIG. 5 is an SEM photograph showing the electron source according to Example 1.

Figure 6:
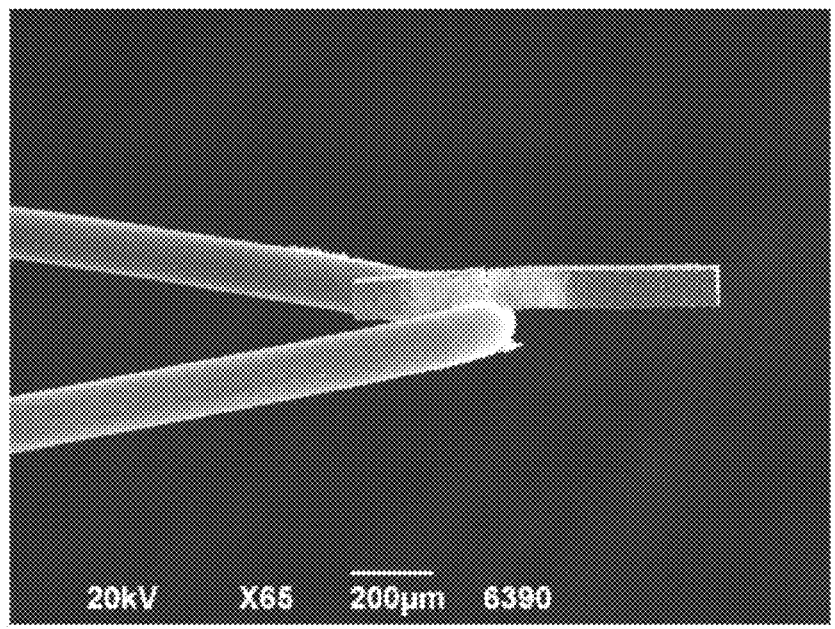

FIG. 6 is an SEM photograph showing the electron source according to Example 2.

Figure 7:
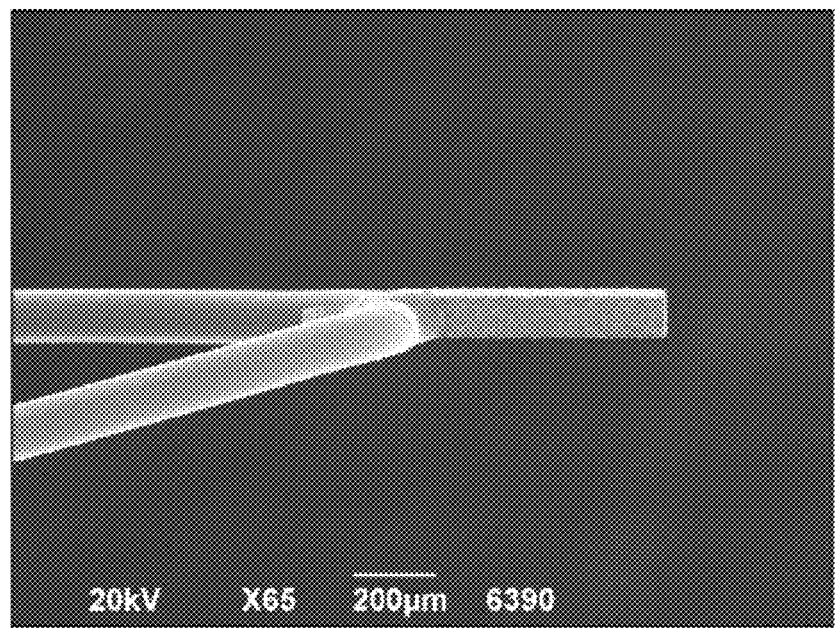

FIG. 7 is an SEM photograph showing the electron source according to Example 3.

DESCRIPTION OF EMBODIMENT

Hereinafter, with reference to the drawings, an embodiment of the present disclosure will be described. In the following description, the same reference signs are used for the same elements or elements having the same function, and duplicate description thereof will be omitted. The present invention is not limited to the following embodiment.

<Electron Source>

Figure 1:
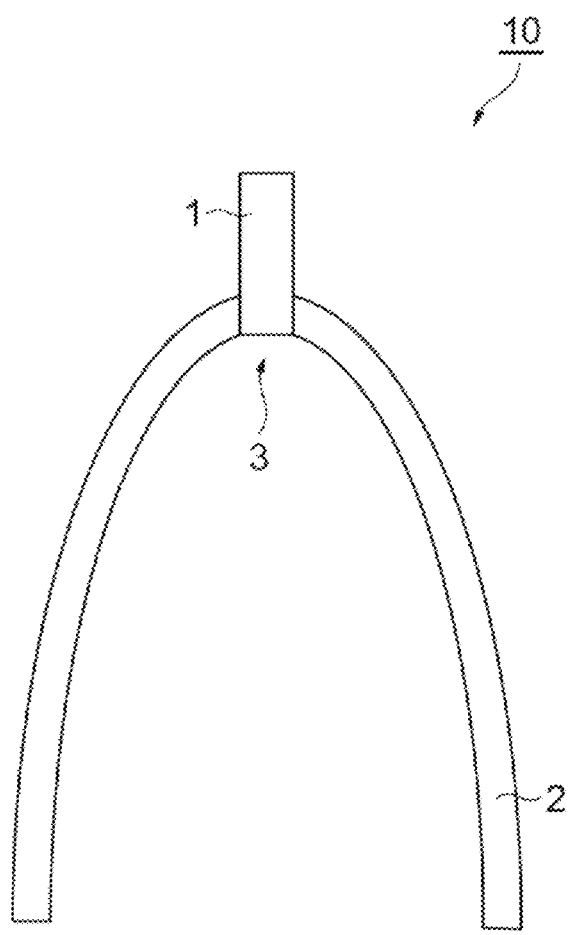
FIG. 1 is a plan view schematically illustrating an embodiment of an electron source according to the present disclosure.

FIG. 1 is a plan view schematically illustrating an electron source according to the present embodiment. An electron source 10 illustrated in FIG. 1 is provided with a LaB$_6$ tip 1, a tungsten filament 2, and a welding portion 3 in which a tip 1 and the tungsten filament 2 are directly bonded. The tip 1 is fixed by welding to an apex portion of the tungsten filament 2 bent in a loop shape. Devices provided with the electron source 10 include electron microscopes, semiconductor manufacturing devices, inspection devices, and machining devices.

The tip 1 emits electrons through heating by means of electrification of the tungsten filament 2. It is preferable that the tip 1 be made of a LaB$_6$ single crystal substance and be a single crystal substance that is machined such that a <100> orientation in which electrons are likely to be emitted coincides with an electron emission direction. It is preferable that a side surface of the tip 1 be a crystal plane which is a (100) plane since it is considered that this slows down an evaporation rate. The tip 1 has substantially a rectangular parallelepiped shape. A distal end portion of the tip 1 may be machined into a conical shape or a pyramid shape. In addition, the shape of the tip 1 is not particularly limited and can be formed into a desired shape by electric discharge machining or the like.

The tungsten filament 2 is used for heating the tip 1 by means of electrification. The tungsten filament 2 may include elements other than tungsten (for example, rhenium, aluminum, silicon, and potassium) in accordance with the required performance. The tungsten filament 2 may be doped with an alkali metal (for example, potassium) for structure stabilization. When the tungsten filament 2 includes rhenium, the rhenium content of the tungsten filament 2 is 2 to 30 mass %, and for example, it may be 2 to 10 mass % or 2 to 5 mass %. Rhenium exhibits an effect of increasing the electrical resistivity of the tungsten filament 2.

The welding portion 3 is a part in which the tip 1 and the tungsten filament 2 are bonded by welding. The welding portion 3 is formed when at least one of the tip 1 and the tungsten filament 2 is temporarily melted through heating and then solidified. A thickness of the welding portion 3 (a thickness T3 in FIG. 2) is 50 to 500 μm, and for example, it may be 50 to 400 μm or 110 to 250 μm. A melting point of the tip 1 is approximately 2,210° C. for example. A melting point of the tungsten filament 2 is approximately 3,422° C., for example.

<Method for Manufacturing Electron Source>

Next, a method for manufacturing the electron source 10 will be described. The electron source 10 is manufactured through the following steps.

(A) A step of sandwiching a welding object 5 in which the tip 1 and the tungsten filament 2 overlap in direct contact between a pair of welding electrodes 6a and 6b (refer to (a) in FIG. 3)

(B) A step of welding the tip 1 and the tungsten filament 2 by causing a current to flow while pressing forces are applied to the welding object 5 by the pair of welding electrodes 6a and 6b (refer to (b) in FIG. 3)

In the step (A), a thickness of the welding object 5 (the total thickness of the tip 1 and the tungsten filament 2, a thickness T5 in (a) in FIG. 3) is within a range of 50 to 500 μm, is preferably 170 to 400 μm, and may be 180 to 350 μm or 180 to 280 μm. The thickness of the welding object 5 is the same, in the step (A), as a separation distance between the pair of welding electrodes 6a and 6b sandwiching the welding object 5. When the thickness of the welding object 5 (the separation distance of the pair of welding electrodes 6a and b) is within the foregoing range, the welding object 5 can be locally heated to a high temperature by means of electrification using the pair of welding electrodes 6a and 6b, and thus the tip 1 and the tungsten filament 2 can be firmly bonded by welding.

A cross-sectional shape of a part in the tip 1 welded to the tungsten filament 2 is a square shape or a rectangular shape of which a length of one side is 10 to 300 μm, for example. The length of one side is preferably 60 to 250 μm and may be 60 to 200 μm or 70 to 150 μm. A cross-sectional shape of a part in the tip 1 welded to the tungsten filament 2 may be a circular shape or an oval shape, for example. In this case, a thickness of the tip 1 in a welding direction (a thickness T1 in (a) in FIG. 3) is preferably 60 to 250 μm and may be 60 to 200 μm or 70 to 150 μm. The arrow A in (a) in FIG. 3 indicates "the welding direction".

A cross-sectional shape of a part in the tungsten filament 2 welded to the tip 1 is a circular shape or an oval shape, for example. A thickness of the tungsten filament 2 in the welding direction (a thickness T2 in (a) in FIG. 3) is preferably 60 to 250 μm and may be 60 to 200 μm or 70 to 150 μm. A cross-sectional shape of a part in the tungsten filament 2 welded to the tip 1 may be a square shape or a rectangular shape, for example. In this case, the thickness of the tungsten filament 2 in the welding direction is preferably 60 to 250 μm and may be 60 to 200 μm or 70 to 150 μm.

A ratio T1/T2 of the thickness T1 of the tip 1 to the thickness T2 of the tungsten filament 2 is preferably 0.6 to 1.4 and is more preferably 0.8 to 1.3. When the ratio T1/T2 is within the foregoing range, a region including an interface between the tip 1 and the tungsten filament 2 in the welding object 5 can be efficiently heated to a high temperature.

In the step (B), the heating temperature can be adjusted by adjusting currents flowing from the pair of welding electrodes 6a and 6b to the welding object 5. Through heating by means of electrification, at least one of the tip 1 and the tungsten filament 2 need only be locally melted, and it is preferable that both the tip 1 and the tungsten filament 2 be locally melted. Pressing forces applied from the pair of welding electrodes 6a and 6b to the welding object 5 need only be set to a strength and a time sufficient for the tip 1 and the tungsten filament 2 to be firmly bonded. The arrow E in (b) in FIG. 3 indicates a direction in which a current flows, and the arrow F indicates a direction of a pressing force.

Figure 2:
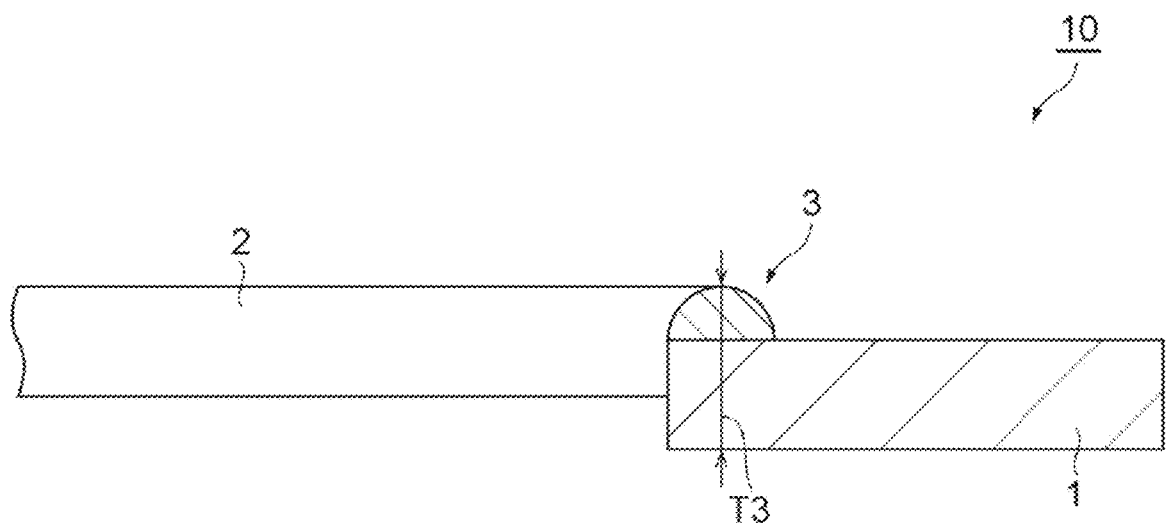
FIG. 2 is a cross-sectional view schematically illustrating a welding portion in the electron source illustrated in FIG. 1.

Regarding the electron source manufactured through the step (B), a form in which the tip 1 is embedded into the tungsten filament 2 may be adopted as illustrated in FIG. 2, or a form in which the tip 1 is bonded to a surface of a tungsten filament 2A may be adopted as illustrated in FIG. 4. The tungsten filament 2A illustrated in FIG. 4 has a quadrangular cross section.

In the foregoing embodiment, a form in which the tip 1 is constituted using a $LaB_6$ single crystal substance has been described as an example. However, the tip 1 may be constituted using a HfC single crystal (melting point: 3,890° C.) or may be constituted using an IrCe compound (for example, $Ir_2Ce$, $Ir_3Ce$, $Ir_7Ce_2$, or $Ir_5Ce$). Even when these electron emission materials are used as the tip 1, a tip and a tungsten filament can be firmly bonded by welding.

EXAMPLE

Hereinafter, the present disclosure will be described on the basis of examples and a comparative example. The present invention is not limited to the following examples.

Example 1

A $LaB_6$ tip and a tungsten filament having the following size were prepared.
<$LaB_6$ Tip>
Thickness T1: 90 μm
Width: 90 μm
Length: 1,000 μm
<Tungsten Filament>
Diameter (thickness T2): 127 μm
Purity of tungsten: 99.999 mass % or more The tip and the tungsten filament were directly welded as follows. First, in a state where the tip and the tungsten filament overlapped in direct contact, these were sandwiched between a pair of welding electrodes (refer to (a) in FIG. 3). The tip and the tungsten filament were welded by causing a current to flow while pressing forces are applied to both of them by the pair of welding electrodes (refer to (b) in FIG. 3). The welding current was set such that the temperature at the interface between the tip and the tungsten filament exceeded 3,422° C. (the melting point of tungsten). As a result, as shown in the SEM photograph of FIG. 5, an electron source having both of them firmly bonded in a state where the tip was embedded into the tungsten filament was obtained.

Comparative Example

A $LaB_6$ tip and a tungsten filament having the following size were prepared.
<$LaB_6$ Tip>
Thickness T1: 500 μm
Width: 750 μm
Length: 1,500 μm
<Tungsten Filament>
Diameter (thickness T2): 127 μm
Purity of tungsten: 99.999 mass % or more Similar to Example 1, welding of the tip and the tungsten filament was attempted. Although the tip and the tungsten filament were heated while variously changing the setting of the welding current, both of them could not be welded.

Example 2

A HfC tip and a tungsten filament having the following size were prepared.
<Hfc Tip>
Thickness T1: 90 μm
Width: 90 μm
Length: 1,000 μm
<Tungsten Filament>
Diameter (thickness T2): 127 μm
Purity of tungsten: 99.999 mass % or more Similar to Example 1, welding of the tip and the tungsten filament was attempted. The welding current was set such that the temperature at the interface between the tip and the tungsten filament exceeded 3,422° C. (the melting point of tungsten). As a result, as shown in the SEM photograph of FIG. 6, an electron source having both of them firmly bonded in a state where a part of the tip was embedded into the tungsten filament was obtained.

Example 3

An IrCe compound ($Ir_7Ce_2$) tip and a tungsten filament having the following size were prepared.
<IrCe Compound Tip>
Thickness T1: 90 μm
Width: 90 μm
Length: 1,000 μm
<Tungsten Filament>
Diameter (thickness T2): 127 μm
Purity of tungsten: 99.999 mass % or more Similar to Example 1, welding of the tip and the tungsten filament was attempted. The welding current was set such that the temperature at the interface between the tip and the tungsten filament exceeded 3,422° C. (the melting point of tungsten). As a result, as shown in the SEM photograph of FIG. 7, an electron source having both of them firmly bonded in a state where the tip was embedded into the tungsten filament was obtained.

REFERENCE SIGNS LIST

1 Tip
2, 2A Tungsten filament
3 Welding portion
5 Welding object
6a, 6b Pair of welding electrodes
10 Electron source

The invention claimed is:
1. A method for manufacturing an electron source, the method comprising steps of:
sandwiching a welding object in which a tip of an electron emission material and a tungsten filament overlap in direct contact between a pair of welding electrodes; and welding the tip and the tungsten filament by causing a current to flow while pressing forces are applied to the welding object by the pair of welding electrodes, wherein a thickness of the welding object is within a range of 50 to 500 μm.

2. The method according to claim 1, wherein a cross-sectional shape of a part welded to the tungsten filament in the tip is a square shape or a rectangular shape in which a length of one side is 10 to 300 μm.

3. The method according to claim 1, wherein the electron emission material is selected from the group consisting of $LaB_6$, HfC, and an IrCe compound.

4. The method according to claim 1, wherein the tungsten filament contains rhenium.

5. An electron source comprising:
a tip of an electron emission material;
a tungsten filament; and
a welding portion in which the tip and the tungsten filament are directly bonded, wherein a thickness of the welding portion is 50 to 500 μm, and wherein the electron emission material is selected from the group consisting of $LaB_6$, HfC, and an IrCe compound.

6. An electron source comprising:
a tip of an electron emission material;
a tungsten filament; and
a welding portion in which the tip and the tungsten filament are directly bonded, wherein a thickness of the welding portion is 50 to 500 μm, wherein the tungsten filament contains rhenium.

7. A device comprising the electron source according to claim 5.

8. A device comprising the electron source according to claim 6.

* * * * *